United States Patent
Shimada et al.

(10) Patent No.: US 11,908,754 B2
(45) Date of Patent: Feb. 20, 2024

(54) METHOD AND SYSTEM FOR CONTROLLING PROFILE OF CRITICAL DIMENSION

(71) Applicant: TAIWAN SEMICONDUCTOR MANUFACTURING COMPANY, LTD., Hsinchu (TW)

(72) Inventors: Jun Shimada, Hsinchu (TW); Chen-Fon Chang, Hsinchu (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 379 days.

(21) Appl. No.: 17/191,905

(22) Filed: Mar. 4, 2021

(65) Prior Publication Data

US 2022/0285229 A1    Sep. 8, 2022

(51) Int. Cl.
| | |
|---|---|
| *H01L 21/68* | (2006.01) |
| *H01L 21/66* | (2006.01) |
| *H01L 21/687* | (2006.01) |
| *H01L 21/67* | (2006.01) |
| *H01L 21/3065* | (2006.01) |

(52) U.S. Cl.
CPC .......... *H01L 22/20* (2013.01); *H01L 21/3065* (2013.01); *H01L 21/67069* (2013.01); *H01L 21/68764* (2013.01)

(58) Field of Classification Search
CPC ................. H01L 22/20; H01L 21/3065; H01L 21/67069; H01L 21/68764; H01L 22/00; H01L 22/10; H01L 22/12; H01L 22/26
See application file for complete search history.

(56) References Cited

U.S. PATENT DOCUMENTS

| | | | |
|---|---|---|---|
| 10,134,581 B2 * | 11/2018 | Li | .............. C23C 16/45555 |
| 10,727,057 B2 * | 7/2020 | Clark | ............... H01L 21/67161 |

\* cited by examiner

*Primary Examiner* — Eduardo A Rodela
(74) *Attorney, Agent, or Firm* — Birch, Stewart, Kolasch & Birch, LLP

(57) ABSTRACT

An etching apparatus is provided to be able to rotate or tilt a substrate holder on which a to-be-processed substrate is placed. According to a profile of a pre-process critical dimension of the substrate, the etching apparatus may rotate or tilt the substrate holder during an etching process in order to achieve a desired profile of a post-process critical dimension of the substrate that is related to the pre-process critical dimension.

20 Claims, 17 Drawing Sheets

(a)

(b)

METHOD AND SYSTEM FOR CONTROLLING PROFILE OF CRITICAL DIMENSION

BACKGROUND

The semiconductor integrated circuit (IC) industry has over the past decades experienced tremendous advancements and is still experiencing vigorous development. A semiconductor fabrication flow includes many deposition processes, photolithography processes, etching processes, and so on. There is a challenge in profile control of a critical dimension for each process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
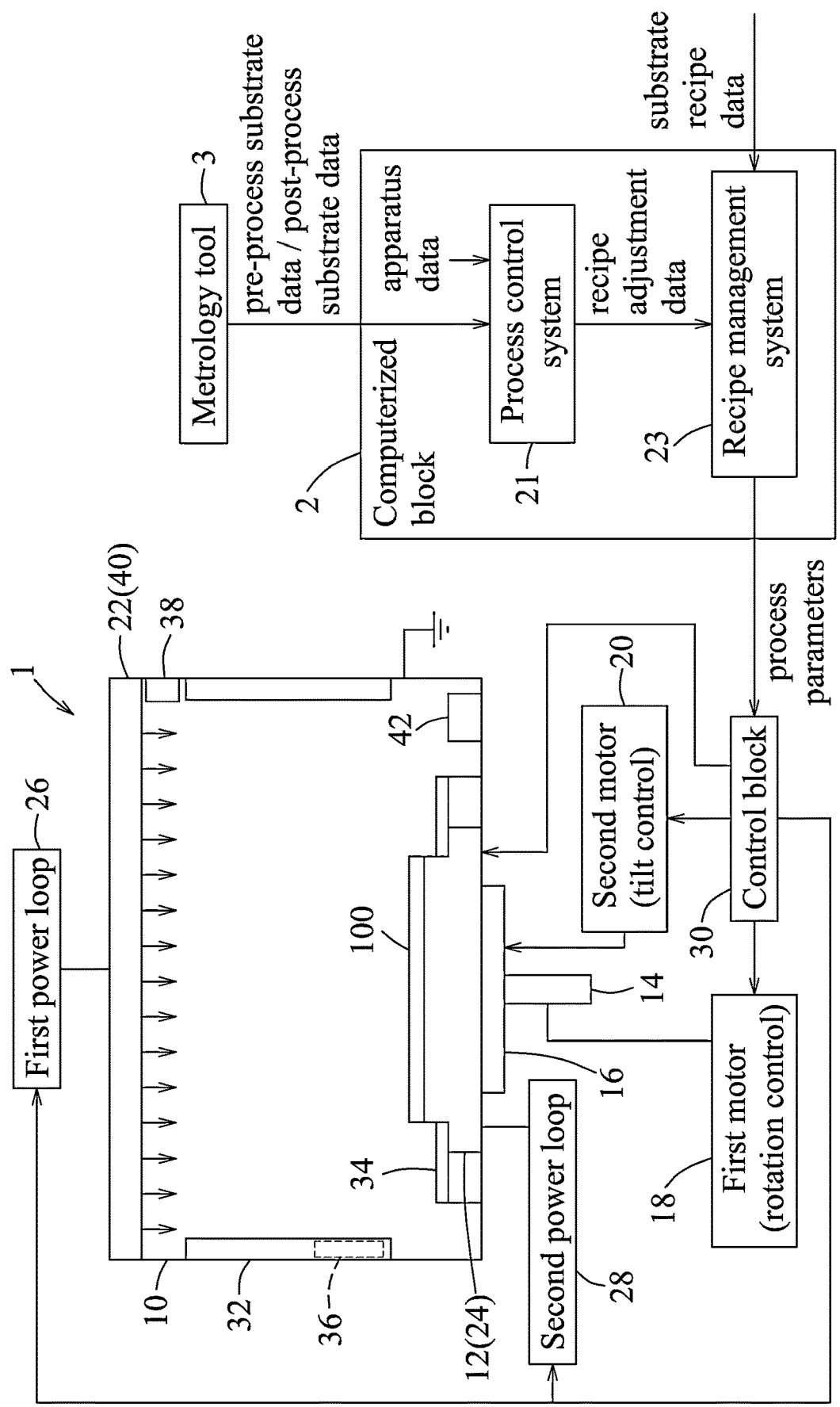
FIG. 1 is a block diagram illustrating a system to perform an etching process in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

This disclosure is related to an etching apparatus. In some embodiments, the etching apparatus is configured to perform a dry etching process, such as a process of vapor etching, plasma etching, other dry etching techniques, or a combination thereof.

FIG. 1 exemplarily shows a system to perform a semiconductor process. The system includes an etching apparatus 1, a computerized block 2 electrically connected to the etching apparatus 1, and a metrology tool 3. In this embodiment, the etching apparatus 1 is exemplified to be, but not limited to, a dry etching apparatus including a chamber 10, a substrate holder 12 that is disposed in the chamber 10, a spindle 14 that is connected to the substrate holder 12, a tilting mechanism 16 that is connected to the substrate holder 12, a first motor 18 that is connected to the spindle 14, a second motor 20 that is connected to the tilting mechanism 16, an anode 22 and a cathode 24 that are disposed in the chamber 10, a first power loop 26 that is electrically connected to the anode 22, a second power loop 28 that is electrically connected to the cathode 24, and a control block 30 that is electrically connected to the substrate holder 12, the first motor 18, the second motor 20, the first power loop 26 and the second power loop 28. In some embodiments, the substrate holder 12 is an electrostatic chuck (ESC) that also serves as the cathode 24. In some embodiments, each of the first power loop 26 and the second power loop 28 is a radio frequency (RF) circuit loop that includes, for example but not limited to, an RF power source, an impedance matching circuitry, a controller and so on, thereby providing RF power to the corresponding one of the anode 22 and the cathode 24. In some embodiments, the control block 30 may include one or more processors/controllers to control operation of the substrate holder 12, the first motor 18, the second motor 20, the first power loop 26 and the second power loop 28. In some embodiments, the tilting mechanism 16 may include, for example but not limited to, gears, rotors, and/or some other components, which are assembled in such a way as to achieve a function of tilting the substrate holder 12 by a desired angle. In some embodiments, the chamber 10 is provided with, as exemplarily shown in FIG. 1 but not limited to, a chamber liner 32, an edge ring 34, a gate 36, a capacitance manometer (CM) port 38, a gas inlet 40, and a pump port 42. The chamber liner 32 is a replaceable component that is attached to an inner wall of the chamber 10 to prevent pollution of the chamber 10. In some embodiments, the chamber liner 32 is coated with, for example but not limited to, Yttrium (Y) and/or other suitable materials. The edge ring 34 surrounds the substrate holder 12 for controlling or adjusting a plasma field (e.g., ion concentration of the plasma) near an edge portion of the substrate holder 12. In some embodiments, the edge ring 34 is made of, for example but not limited to, quartz, silicon, other suitable materials, or a combination thereof. The gate 36 is configured for transfer of a substrate (e.g., a semiconductor wafer or the like) into and out of the chamber 10 therethrough, and the chamber liner 32 may be formed with an opening corresponding in position to the gate 36 for allow for the transfer of the substrate. The CM port 38 is connected to a capacitance monometer (not shown) for measuring a pressure in the chamber 10. The gas inlet 40 is connected to a gas injection system (not shown) and is configured for introducing gases into the chamber 10 for reaction with the substrate. In some embodiments, the gas inlet 40 may be integrated with the anode 22 by forming a plurality of holes into the anode 22. The pump port 42 is connected to a vacuum pump (not shown) that is used to draw gases out of the chamber 10.

Figure 2:
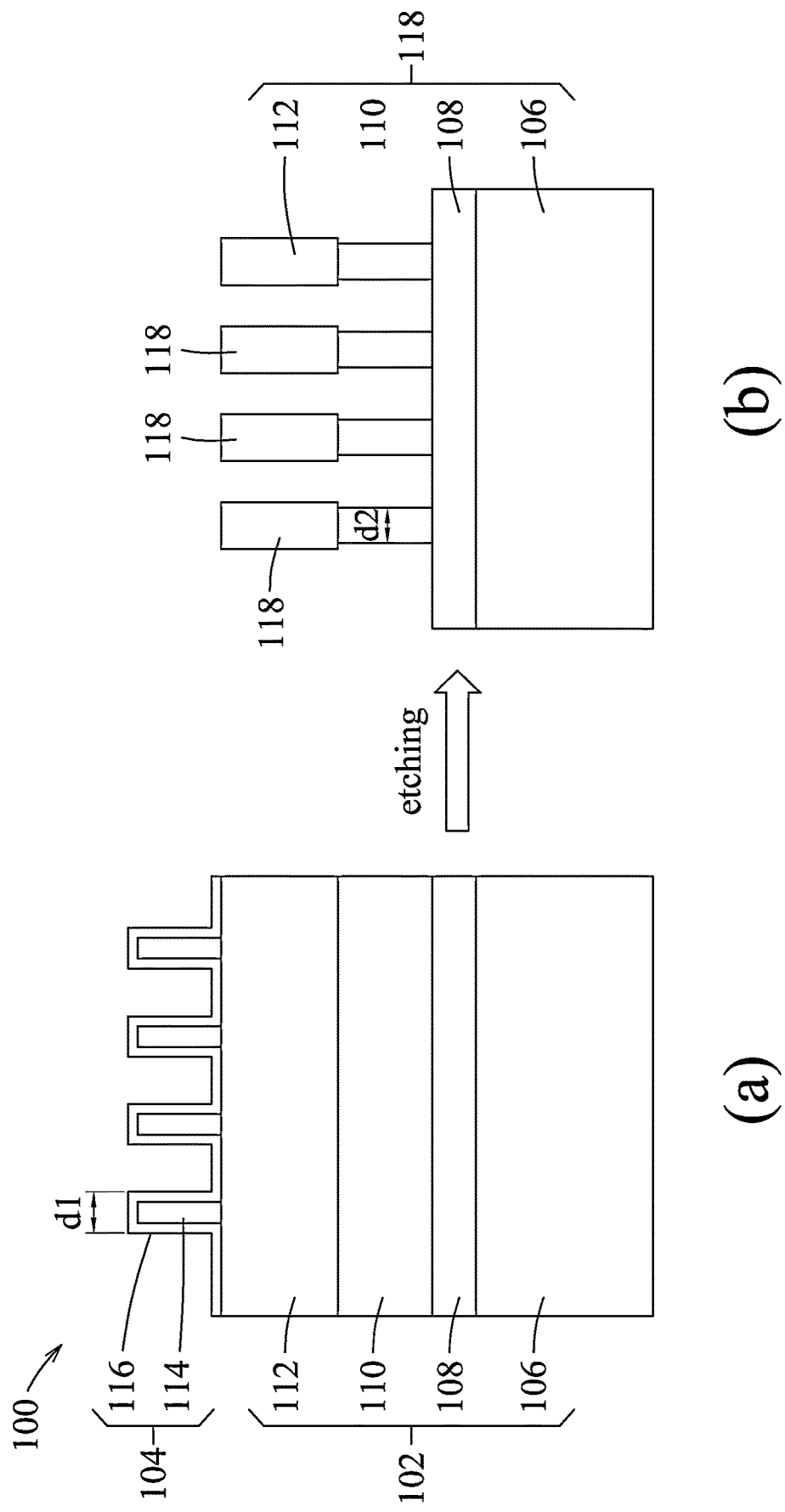
FIG. 2 is a schematic diagram illustrating an exemplary pre-process structure and an exemplary post-process structure on a substrate in accordance with some embodiments.
Figure 3:
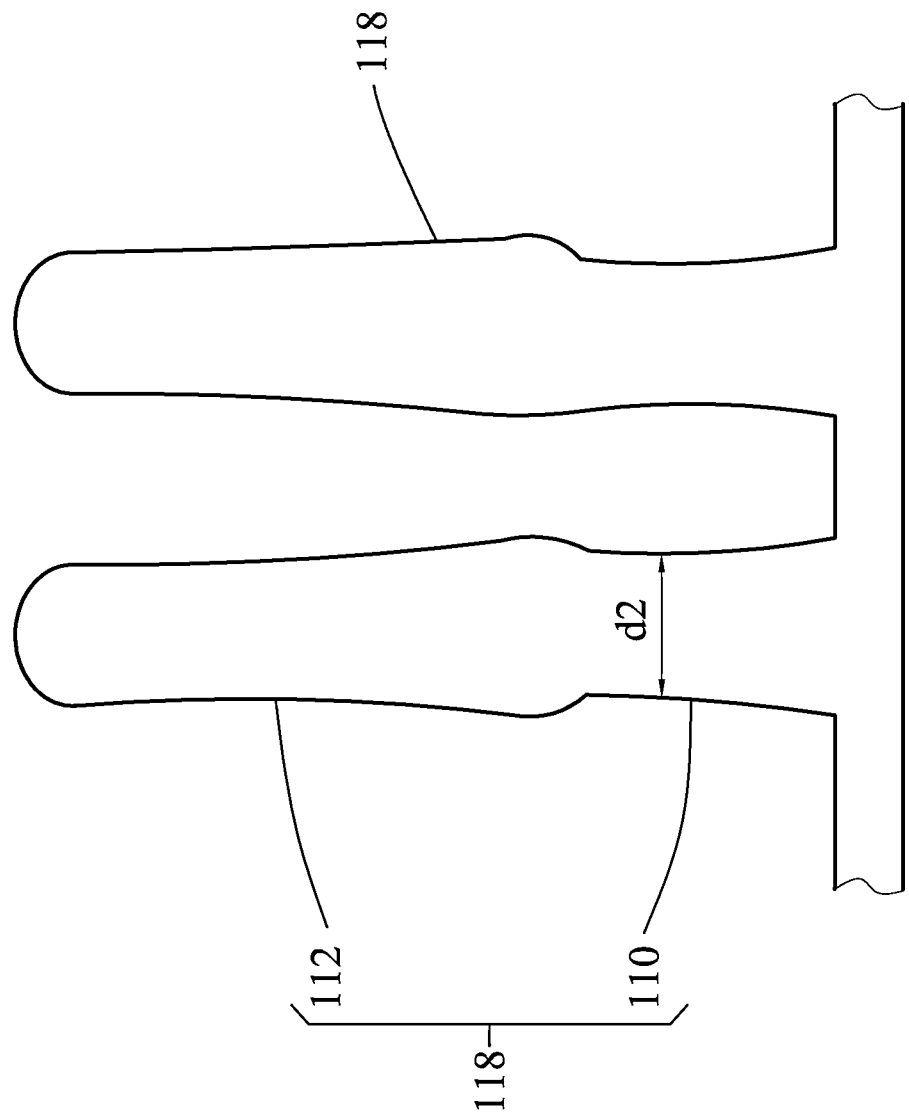
FIG. 3 is a schematic diagram exemplarily illustrating a possible real shape of the exemplary post-process structure after the etching process.

In an example as shown in part (a) of FIG. 2, a substrate 100 is to be treated with an etching process in the chamber 10 of the etching apparatus 1. The etching process may include one or more etching steps. In the illustrative embodiment, the etching process includes multiple etching steps to form mask features (see features 118 in part (b) of FIG. 2) that is used to form semiconductor fins on the substrate 100. The substrate 100 corresponds to a piece of substrate recipe data indicating a substrate process recipe that is predetermined for the substrate 100 to be processed by the etching apparatus 1 and that may correspond to the one or more etching steps of the etching process. The substrate 100 may be formed to include, but not limited to, a stacked structure 102 and a plurality of first mask features 104 formed over the stacked structure 102. In the illustrative embodiment, the first mask features 104 are fin shaped. The stacked structure 102 is exemplified to include, but not limited to, a bulk semiconductor layer 106, a first dielectric layer 108, a second dielectric layer 110 and a third dielectric layer 112 that are stacked in the given order from bottom to top. The bulk semiconductor layer 106 may include: an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; or an alloy semiconductor, such as SiGe, GaAsP, AlInAs, AlGaAs, GaInAs, GaInP, GaInAsP, and/or other suitable materials. The bulk semiconductor layer 106 may be a single-layer material having a uniform composition. Alternatively, the bulk semiconductor layer 106 may include multiple material layers having similar or different compositions suitable for IC device fabrication. In one example, the bulk semiconductor layer 106 may be a silicon-on-insulator (SOI) substrate having a silicon layer formed on a silicon oxide layer. In some embodiments, the first dielectric layer 108 may be a pad oxide layer that includes, for example but not limited to, $SiO_2$, other suitable materials, or a combination thereof. In some embodiments, the second dielectric layer 110 may be a pad nitride layer that includes, for example but not limited to, SiN, $Si_3N_4$, other suitable materials, or a combination thereof. In some embodiments, the third dielectric layer 112 may be an oxide layer that includes, for example but not limited to, $SiO_2$, other suitable materials, or a combination thereof. In the illustrative embodiment, the fin-shape first mask features 104 may be formed by a fourth dielectric layer 114, and a fifth dielectric layer 116 conformally formed over the fourth dielectric layer 114. In some embodiments, the fourth dielectric layer 114 may include, for example but not limited to, a nitride material such as SiN, $Si_3N_4$, other suitable materials, or a combination thereof. In some embodiments, the fifth dielectric layer 116 may include, for example but not limited to, a nitride material such as SiN, $Si_3N_4$, other suitable materials, or a combination thereof. The fourth dielectric layer 114 and the fifth dielectric layer 116 may be of the same or different materials. The fourth dielectric layer 114 may be formed using, for example but not limited to, chemical vapor deposition (CVD), followed by a suitable etching process into a plurality of fin-shape features. Then, the fifth dielectric layer 116 may be formed over the fourth dielectric layer 114 using, for example but not limited to, atomic layer deposition (ALD), so as to form the first mask features 104 with the desired width (d1). The fifth dielectric layer 116 is used to adjust the width of each of the first mask features 104. In one embodiment, each of the first mask features 104 has a pre-process critical dimension, which, in some embodiments, may be a width (d1) thereof, which is a combined width of the corresponding one of the fin-shape features of the fourth dielectric layer 114 and a portion of the fifth dielectric layer 116 formed on the corresponding one of the fin-shape features of the fourth dielectric layer 114. In this exemplary process, the etching apparatus 1 first etches the fifth dielectric layer 116 using, for example but not limited to, an anisotropic etching technique such as plasma etching, so as to remove horizontal portions of the fifth dielectric layer 116 that are disposed on the third dielectric layer 112 while maintaining the width (d1) of the first mask features 104. Then, using the fin-shape features of the fourth dielectric layer 114 and the fifth dielectric layer 116 disposed thereon (i.e., the fin-shape first mask features 104) as an etching mask, the third dielectric layer 112 and the second dielectric layer 110 are etched in sequence. In some embodiments, the fin-shape first mask features 104 are removed during the etching of the second dielectric layer 110, thereby obtaining a plurality of second mask features 118 as exemplarily shown in part (b) of FIG. 2. Each of the second mask features 118 has a post-process critical dimension, which is exemplified as a width (d2). In some embodiments, the width (d2) may refer to a width of the second dielectric layer 110 of each of the second mask features 118, but this disclosure is not limited in this respect. In practice, the second mask features 118 may be formed to have a shape as exemplified in FIG. 3, which may not have a straight contour. In such a condition, the measured value of the post-process critical dimension for a single second mask feature 118 can be an average value of the widths (d2) of the second mask feature 118 that are measured at multiple heights of the second dielectric layer 110 of the second mask feature 118. After the second mask features 118 are formed on the bulk semiconductor layer 106, the substrate 100 may be subjected to a cleaning process, a conformal oxide deposition process, and a fin etch process that uses the second mask features 118 as a mask to form the semiconductor fins from the bulk semiconductor layer 106.

Figure 4:
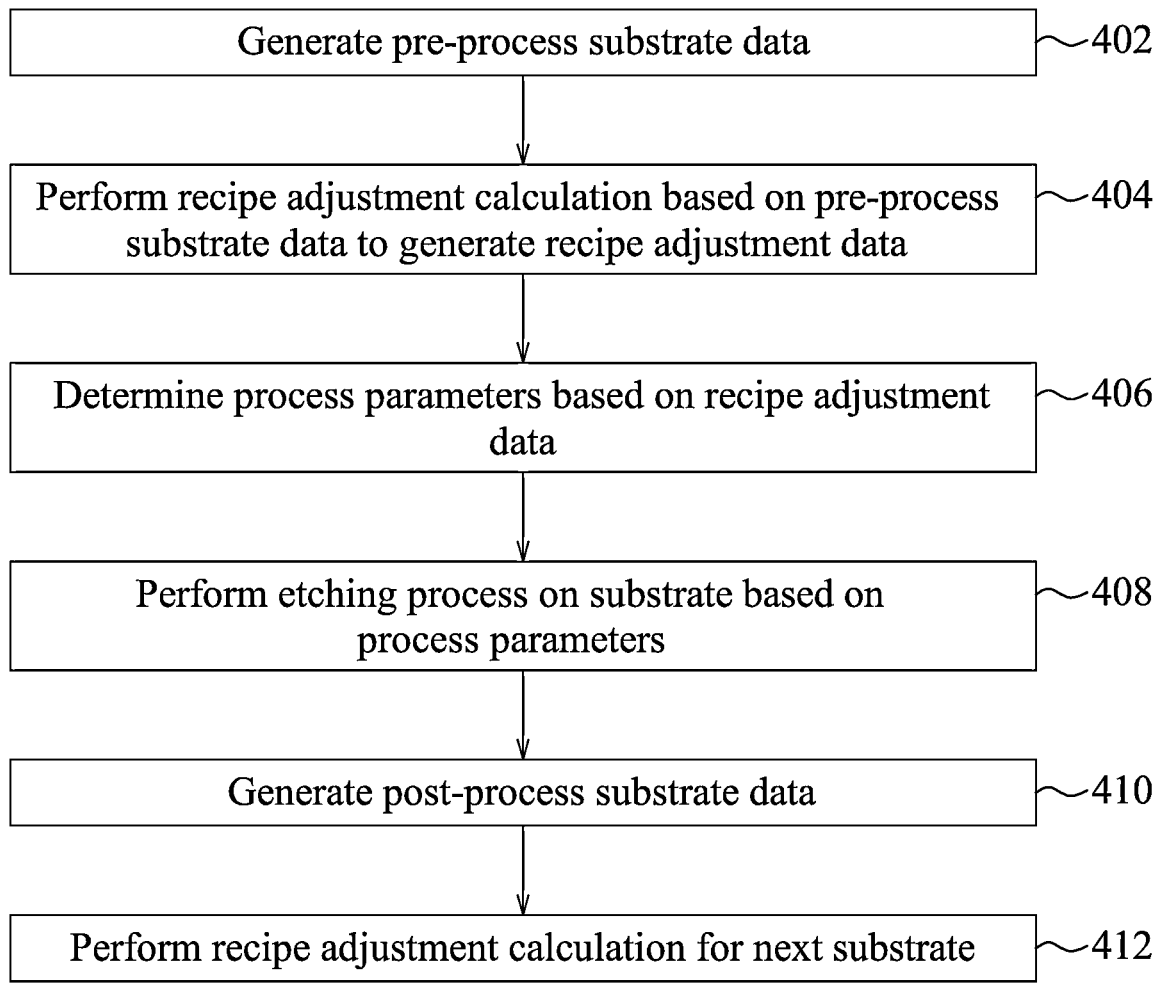
FIG. 4 is a flow chart illustrating steps of a method for controlling a profile of a critical dimension of the substrate in accordance with some embodiments.
Figure 5:
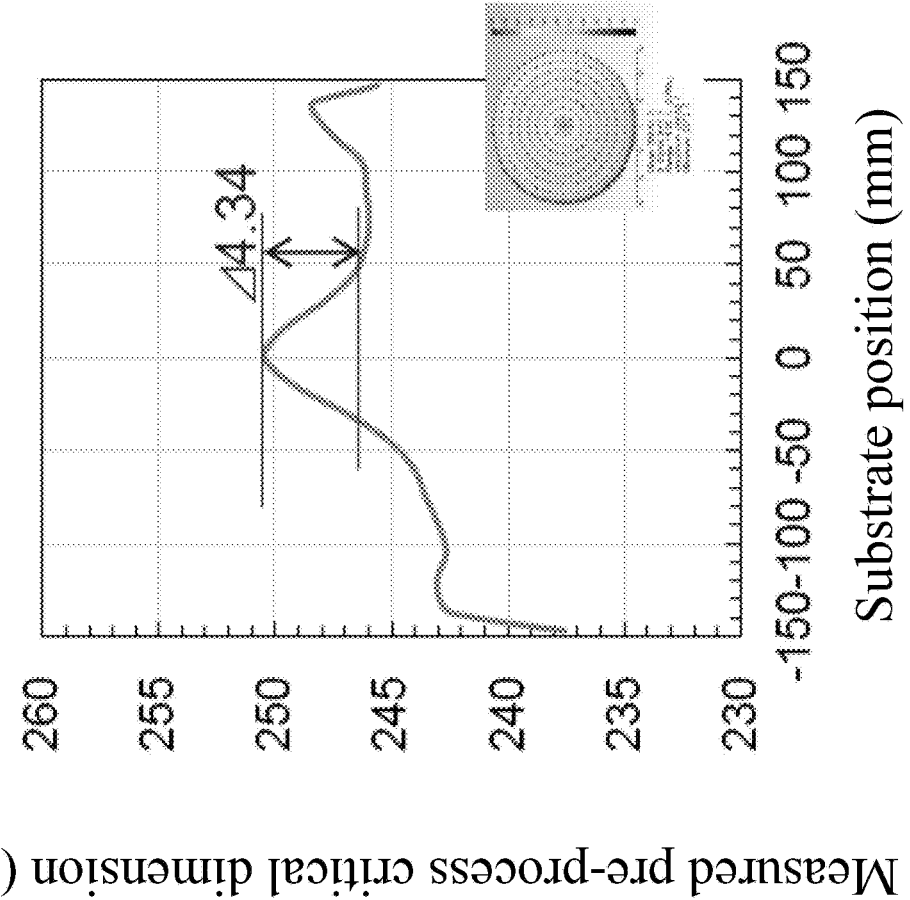
FIG. 5 is a plot illustrating a piece of pre-process substrate data in accordance with some embodiments.

Referring to FIG. 4, before the substrate 100 is processed by the etching apparatus 1, the metrology tool 3 may be used to measure the pre-process critical dimension at different positions of the substrate 100, so as to generate pre-process substrate data that indicates the measured values of the pre-process critical dimension and/or a profile or a distribution of the pre-process critical dimension of the substrate 100 (step 402). FIG. 5 exemplifies a piece of the pre-process substrate data showing that the substrate 100 has poor uniformity in terms of the pre-process critical dimension (e.g., the widths (d1) of the first mask features 104), where the pre-process critical dimension measured at a central portion of the substrate 100 is greater than that measured at a peripheral portion of the substrate 100 on average, forming a dome-shape profile. The pre-process substrate data is then provided to the computerized block 2.

Referring to FIG. 1, in some embodiments, the computerized block 2 includes, but not limited to, a process control system 21, and a recipe management system 23 that stores a plurality of process recipes therein. The substrate process recipe corresponds to one of the process recipes stored in the recipe management system 23. Each of the process recipes may include parameters of, for example but not limited to, a temperature of the substrate holder 12, process time, a rotational speed of the substrate holder 12, a tilt angle of the substrate holder 12, RF power, process pressure, a gas flow rate, etc. The process control system 21 may include a processing unit or a processor to perform required computation, and is communicatively connected to the metrology tool 3 for receiving the pre-process substrate data that corresponds to the substrate 100. Based on the results of the metrology tool 3, the process control system 21 performs a recipe adjustment calculation for the substrate 100 to generate recipe adjustment data (step 404 in FIG. 4). The recipe adjustment calculation includes calculating adjustment to be made to the substrate process recipe as indicated by the substrate recipe data based on the pre-process substrate data. The recipe adjustment data indicates the adjustments thus calculated. For example, when the pre-process substrate data indicates that the measured pre-process critical dimension is commonly greater than a standard value throughout the substrate 100, the recipe adjustment data calculated by the process control system 21 may include adjustment in terms of the process time (e.g., increasing etching time in the illustrative embodiment), the temperature of the substrate holder 12 (e.g., increasing or decreasing overall temperature of the substrate holder 12 to promote etching speed in the illustrative embodiment), the RF power (e.g., adjusting the RF power to promote etching speed in the illustrative embodiment), the process pressure (e.g., increasing or decreasing the process pressure to promote etching speed in the illustrative embodiment), the gas flow rate (e.g., adjusting the gas flow rate to promote etching speed in the illustrative embodiment), other suitable parameters, or a combination thereof. For example, the recipe adjustment data may indicate how many seconds should be added to or reduced from the original process time as indicated in the substrate process recipe, how many degrees of Celsius should be added to or reduced from the original temperature of the substrate holder 12 as indicated in the substrate process recipe, and so on.

Figure 6:
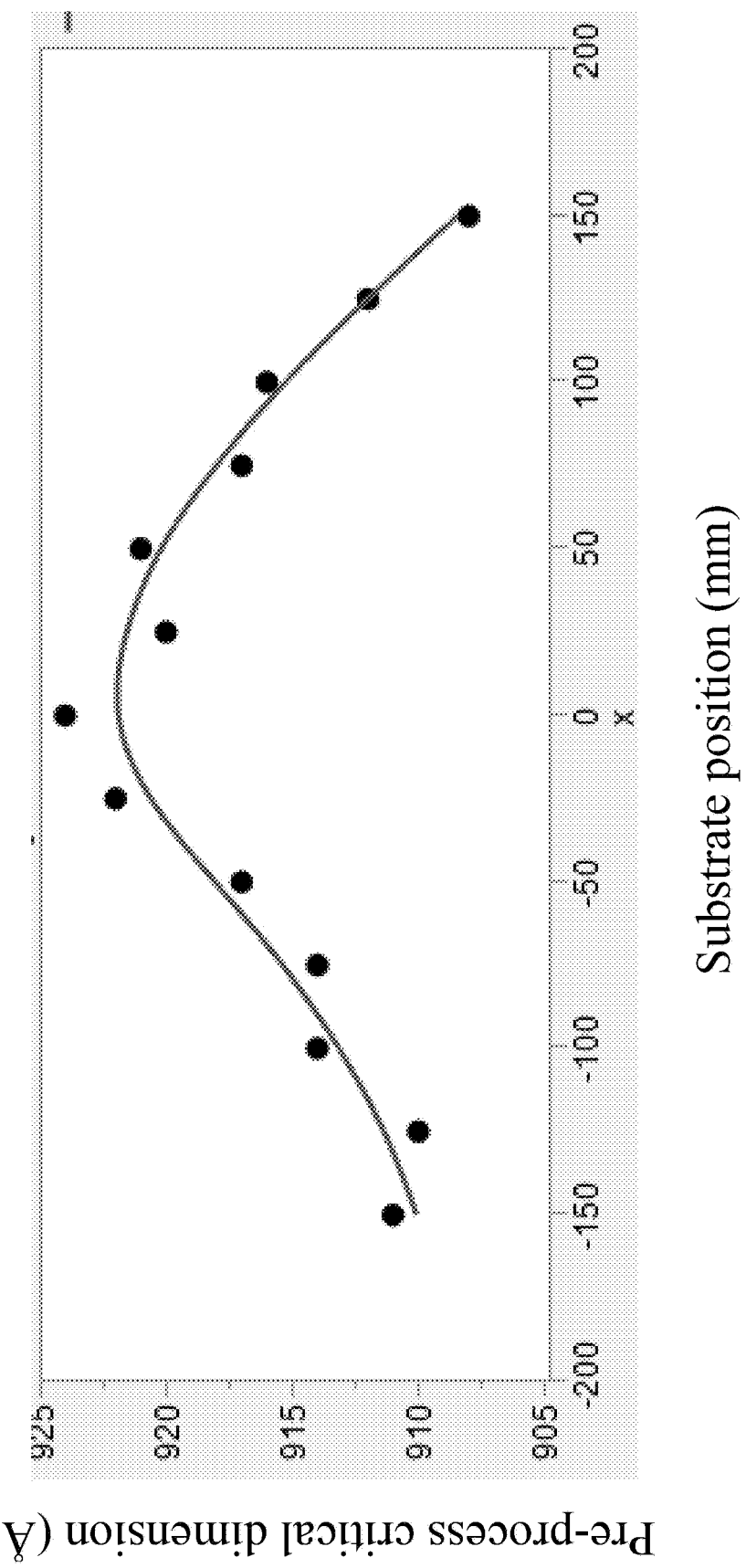
FIG. 6 is a plot illustrating a piece of pre-process substrate data in accordance with some embodiments.

In some embodiments, as exemplified in FIG. 5 or FIG. 6 where the substrate 100 has a dome-shape profile in terms of the pre-process critical dimension (e.g., the pre-process critical dimension measured at the central portion of the substrate 100 is greater than that measured at the peripheral portion of the substrate 100 on average), the process control system 21 may generate the recipe adjustment data to apply multi-zone temperature control to the substrate holder 12, to apply multi-gas-injection control, to rotate the substrate holder 12, to apply other suitable method, or to perform the abovementioned methods in combination.

In some embodiments, the substrate holder 12 is configured to include several independently controlled portions. For example, the substrate holder 12 may be configured to have a structure of concentric circles including a circular first portion, an annular second portion surrounding the circular first portion, an annular third portion surrounding the annular second portion, and so on, and the temperature of each of these portions can be independently controlled, so the multi-zone temperature control can be applied by, for example but not limited to, making these portions of the substrate holder 12 have their own temperatures as desired, so as to make different portions of the substrate 100 that respectively correspond to these portions of the substrate holder 12 respectively have desired etching rates (e.g., the inner portion of the substrate 100 having a higher etching rate than the outer portion of the substrate 100) to achieve the desired etching result. In some embodiments, the desired etching result may be that the post-process critical dimension is relatively more uniform throughout the substrate 100 than the pre-process critical dimension. The uniformity of a dimension of concern (e.g., the pre-process critical dimension or the post-process critical dimension) may be defined as being related to a difference between a maximum value ($d_{max}$) and a minimum value ($d_{min}$) among the measured values of the dimension of concern. For example, the uniformity of a dimension of concern (U %) may be defined (but not limited to) as:

$$U\% = (d_{max} - d_{min})/d_{mean},$$

where $d_{mean}$ represents a mean value of the measured values of the dimension of concern.

In some embodiments, the chamber 10 may be configured to include several gas inlets, so multi-gas-injection can be applied by injecting gases into the chamber 10 from several directions and/or locations, thereby controlling the gas flow in the chamber 10. In some embodiments, the injection of the gases may be adjusted in such a way that the gas concentration is relatively higher or lower at a location that corresponds to a portion of the substrate 100 with greater measured values of the pre-process critical dimension, so as to promote the etching rate at that portion. As a result, the desired etching result may be achieved by designing the injection of the gases via multiple gas inlets.

Figure 7:
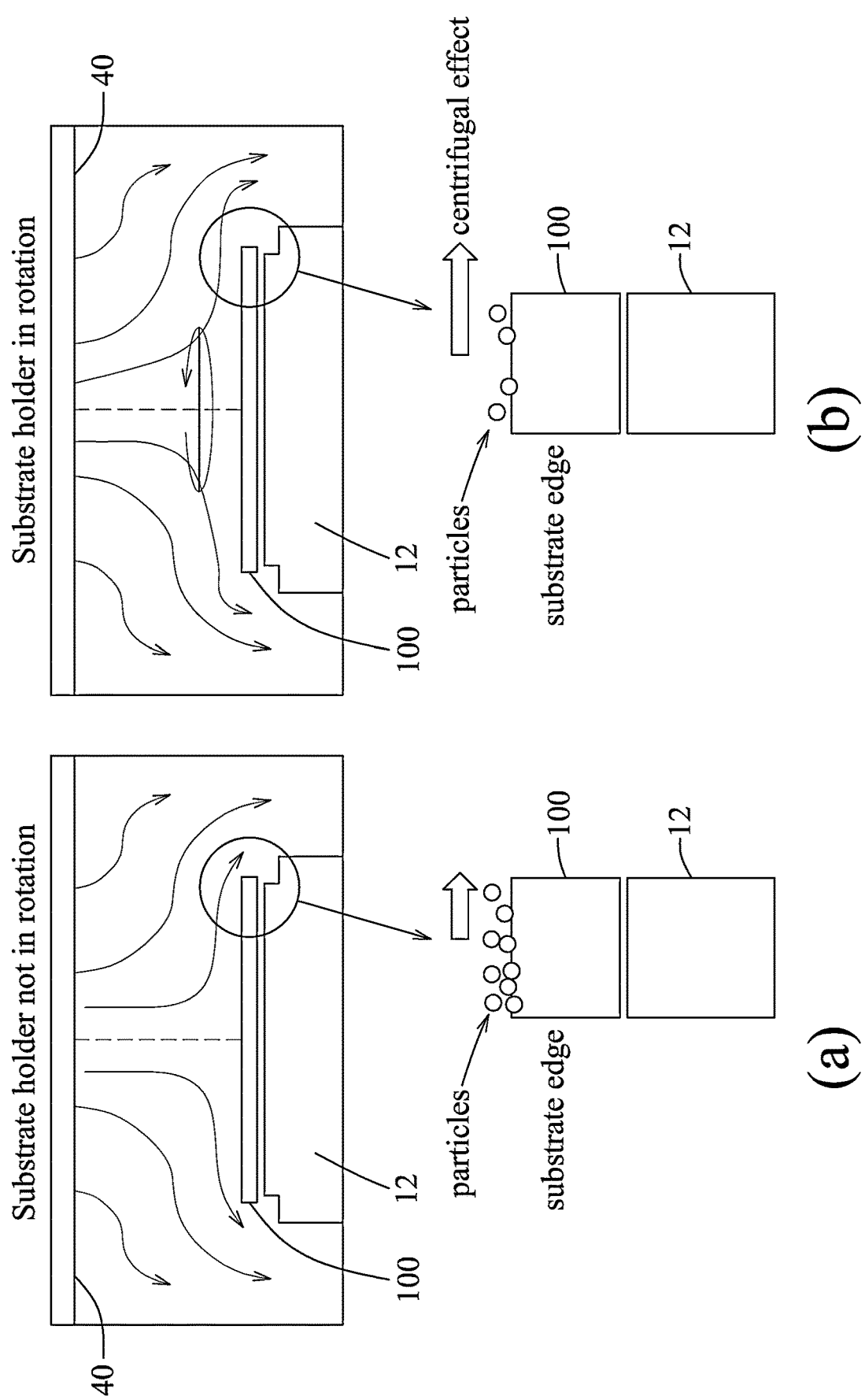
FIG. 7 is a schematic diagram illustrating a centrifugal effect resulting from rotation of a substrate holder of the system in accordance with some embodiments.

In some embodiments, the substrate holder 12 is rotated to adjust concentrations of particles (e.g., particles of gas, ions, etc., which are provided to etch the substrate 100) on different portions of the substrate 100. The particles may be provided over the substrate 100 that is temporarily attached to the substrate holder 12, and may be, for example, molecules of the gases that are injected into the chamber 10 or ions of plasma that result from applying the RF power to the gases via the anode 22 and the cathode 24 during the process. When the substrate holder 12 rotates during the process, the resultant centrifugal force may bring the particles on the substrate 100 away from the substrate 100, so the reaction rate (e.g., etching rate) may be reduced. The centrifugal force is proportional to a radius of a circle, so the centrifugal force is strongest at the peripheral portion of the substrate 100 and weakest at the central portion of the substrate 100. Referring to FIG. 7, part (a) illustrates a scenario where the substrate holder 12 is not in rotation, and the force that brings the particles away from the substrate 100 may result from the gas flow. Part (b) of FIG. 7 illustrates a scenario where the substrate holder 12 is in rotation, where the resultant centrifugal force reduces the concentration of the particles on the peripheral portion of the substrate 100, thereby lowering the reaction rate at the peripheral portion of the substrate 100. When the profile of the pre-process critical dimension (e.g., the widths (d1) of the first mask features 104 in FIG. 2) of the substrate is in the dome-shape as shown in FIG. 6, namely, the pre-process critical dimension measured at the central portion is greater than that measured at the peripheral portion, rotating the substrate holder 12 may make the peripheral portion have a lower etching rate than the central portion, so the resultant post-process critical dimension (e.g. the widths (d2) of the second mask features 118 in FIG. 2) may have a relatively higher uniformity in comparison to the pre-process critical dimension. The greater the rotational speed of the substrate holder 12, the stronger the centrifugal effect, and thus, the greater the rotational speed of the substrate holder 12, the greater the difference between the etching rate at the peripheral portion of the substrate and the etching rate at the central portion of the substrate. As a result, the rotational speed of the substrate holder 12 can be adjusted based on the severity of non-uniformity of the pre-process critical dimension as indicated in the pre-process substrate data. In some embodiments, the rotational speed of the substrate holder 12 determined by the process control system 21 is positively correlated to a difference between an average of the measured values of the pre-process critical dimension that were measured at the peripheral portion of the substrate 100 and an average of the measured values of the pre-process critical dimension that were measured at the central portion of the substrate 100.

The recipe management system 23 is disposed to receive the substrate recipe data, and receives the recipe adjustment data from the process control system 21. In the illustrative embodiment, the substrate process recipe for the substrate 100 exemplified in FIG. 2 may include parameters predetermined for etching the fifth dielectric layer 116, parameters predetermined for etching the third dielectric layer 112, and parameters predetermined for etching the second dielectric layer 110. The recipe management system 23 determines process parameters for the substrate 100 (step 406 in FIG. 4) based on the recipe adjustment data and the substrate process recipe as indicated in the substrate recipe data, and transmits process data that includes the process parameters thus determined to the control block 30 of the etching apparatus 1. For example, when a substrate process recipe predetermined for the substrate 100 indicates that the process time for etching a specific dielectric layer is 10 seconds and the recipe adjustment data indicates that the adjustment in terms of the process time of the recipe is +2 seconds, the recipe management system 23 determines that the process time for etching the specific dielectric layer of the substrate 100 is 12 seconds. In general, the rotational speed and the tilt angle included in the substrate process recipe may be set to zero because it is presumed that the reaction environment (e.g., the gas flow, the plasma field, the concentration of the particles, etc.) and the substrate profile (e.g., the profile of the pre-process critical dimension) are uniform. If the reaction environment or the substrate profile is not uniform, the process control system 21 may determine adjustment to be applied to the rotational speed and the tilt angle of the substrate process recipe, so the recipe management system 23 determines the rotational speed and the tilt angle for the corresponding process step(s) to be non-zero.

Referring to FIG. 1, in order to proceed with an etching process by the etching apparatus 1, the substrate 100 (e.g., a wafer) is transferred into the chamber 10 through the gate 36, and is then placed on the substrate holder 12. After the gate 36 is closed, the control block 30 of the etching apparatus 1 controls the first motor 18, the second motor 20, the first power loop 26, the second power loop 28, the gas injection system and the vacuum pump to perform a process on the substrate 100 based on the process parameters (step 408 in FIG. 4). The vacuum pump draws the gases out of the chamber 10 via the pump port 42 to generate vacuum in the chamber 10. Then, gas for processing the substrate 100 is introduced into the chamber 10 via the gas inlet 40. In a case that the process is to etch an oxide material, the gas may include, for example but not limited to, $C_4F_6$, $CHF_3$, $CF_4$, Ar, $O_2$, $N_2$, other suitable gases, or a combination thereof. In a case that the process is to etch a nitride material, the gas may include, for example but not limited to, $C_4F_6$, $CHF_3$, Ar, $O_2$, $N_2$, other suitable gases, or a combination thereof. In a case that the process is to etch polysilicon, the gas may include, for example but not limited to, HBr, $Cl_2$, Ar, $O_2$, $N_2$, other suitable gases, or a combination thereof. The capacitance manometer monitors the pressure in the chamber 10 via the CM port 38. In some embodiments that perform a plasma etching process, the first power loop 26 and the second power loop 28 may be controlled to apply RF power via the anode 22 and the cathode 24 to the gases that are injected into the chamber 10 to ionize the gases, so as to generate plasma that etches the dielectric layer(s) of the substrate 100. In some embodiments where the pre-process critical dimension measured at the central portion of the substrate 100 is greater than that measured at the peripheral portion of the substrate 100 (as exemplified in FIGS. 5 and 6), the control block 30 may control the substrate holder 12 to rotate according to the process parameters provided by the recipe management system 23, so as to reduce the etching rate at the peripheral portion of the substrate 100 in order to promote the uniformity of the post-process critical dimension. In some embodiments, the time it takes for the substrate holder 12 to rotate by one revolution, which is indicative of the rotational speed of the substrate holder 12, may, for example but not limited to, range from about 7 seconds to about 10 seconds per revolution. If the rotation is too fast (e.g., below 7 seconds per revolution), the substrate 100 may shift in position, which may adversely affect the result of the process. If the rotation is too slow (e.g., exceeding 10 seconds per revolution), the centrifugal force may be too small to achieve the desired effect. However, different apparatus design and/or different process may result in variation in the effective range of the rotational speed of the substrate holder 12, so this disclosure is not limited to the range mentioned above.

Figure 8:
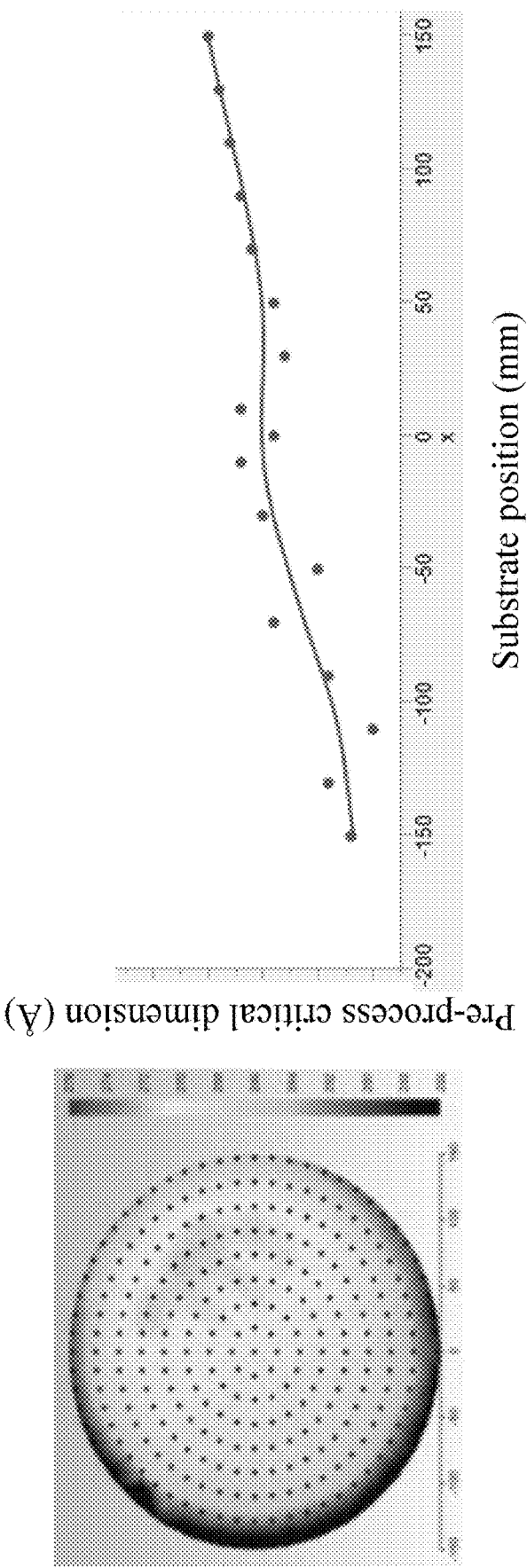
FIG. 8 is a plot illustrating a piece of pre-process substrate data in accordance with some embodiments.

FIG. 8 exemplifies a piece of the pre-process substrate data indicating that the pre-process critical dimension measured a specific portion (e.g., the upper right portion in the left part of FIG. 8) of the substrate 100 (represented by a circle) that corresponds to a specific angular range (e.g., about from 20-degree position to 110-degree position with reference to the 12-o'clock position of the substrate 100 that serves as a zero-degree position) is greater than the pre-process critical dimension measured at the other portion on average. In such a case, the process control system 21 may generate the recipe adjustment data to apply the multi-zone temperature control to the substrate holder 12, apply the multi-gas injection control, adjust the rotational speed of the substrate holder 12, adjust the tilt angle of the substrate holder 12, apply other suitable method, or perform the abovementioned methods in combination.

Figure 9:
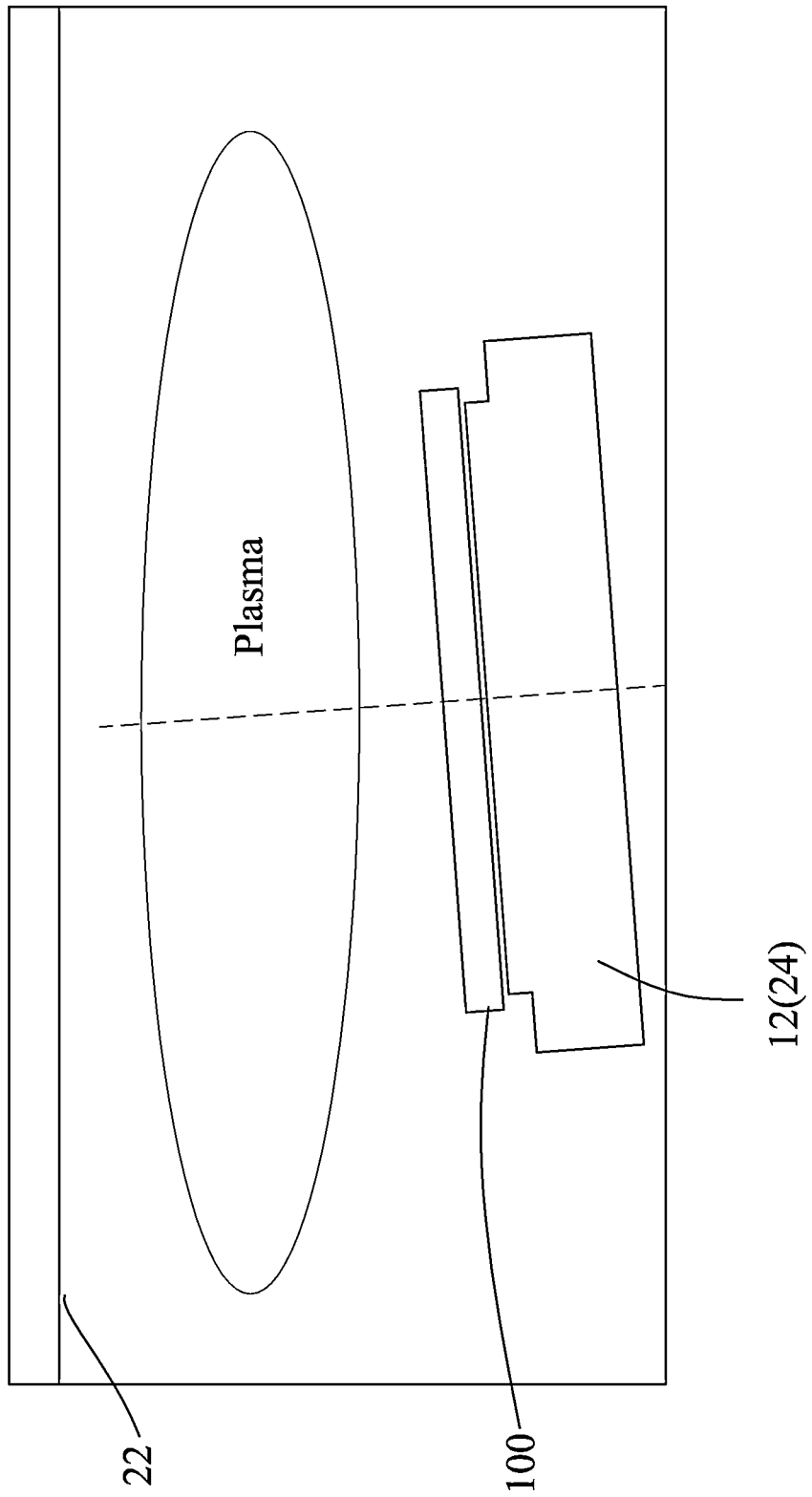
FIG. 9 is a schematic diagram illustrating that the substrate holder is tilted in accordance with some embodiments.

In some cases where reaction environment is uniform (e.g., an etching plasma is uniformly distributed in the chamber 10), the adjustment calculated by the process control system 21 may include tilting the substrate holder 12 to create an uneven reaction environment for the substrate 100 that corresponds to the pre-process substrate data exemplified in FIG. 8 (e.g., to etch a specific portion of the substrate 100 faster than other portions of the substrate 100). As illustrated in FIG. 9, when the substrate holder 12 is tilted to lift up the specific portion of the substrate 100 during the process, the specific portion would be in an environment with a higher particle concentration or a stronger plasma field than the remaining portion, thereby making the reaction rate at the specific portion higher than that at the remaining portion, and thus improving the uniformity of the post-process critical dimension. In some embodiments, the tilt angle of the substrate holder 12 may range between, for example but not limited to, about 0 degrees and about 5 degrees. If the tilt angle of the substrate holder 12 is too large (e.g., exceeding 5 degrees), the substrate 100 may shift in position, which may adversely affect the result of the process. However, different apparatus design and/or different process may result in variation in the effective range of the tilt angle of the substrate holder 12, so this disclosure is not limited to the range mentioned above.

Figure 10:
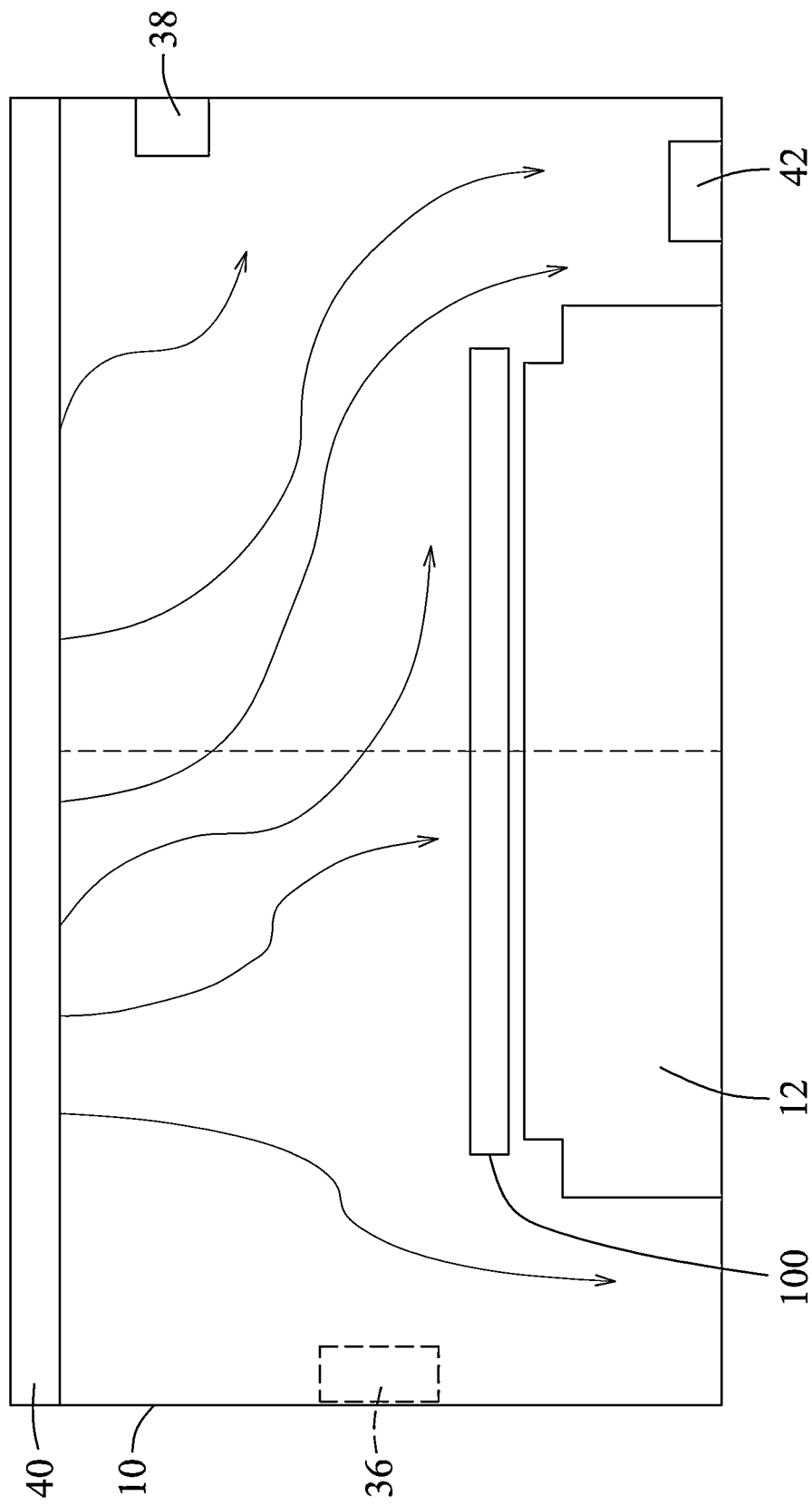
FIG. 10 is a schematic diagram illustrating an uneven gas flow in a chamber of the system in accordance with some embodiments.

In some cases, asymmetric placement of the gate 36, the capacitance manometer port 38, the pump port 42 and some other elements that are disposed in the chamber 10 may result in uneven gas flow and/or uneven pressure distribution in the chamber 10, as illustrated in FIG. 10, making the concentration of the particles and/or the plasma field within the chamber 10 non-uniform and thus creating uneven reaction rates at different regions in the chamber 10. Apparatus data that indicates such non-uniformity of the etching apparatus 1 can be established by inspecting results of processes that were previously performed by the etching apparatus 1. For example, each time a substrate is processed using the etching apparatus 1, the metrology tool 3 can be used to obtain a distribution or profile of the post-process critical dimension. By comparing the distribution/profile of the post-process critical dimension and the distribution/profile of the pre-process critical dimension, the asymmetric characteristic of the chamber design can be derived to establish the apparatus data. In order to make the post-process structure (e.g., the second mask features 118) uniform in terms of the post-process critical dimension, the recipe adjustment data may include adjustment that makes the substrate holder 12 rotate at a varying rotational speed during the process. In some embodiments where the apparatus data indicates that a specific region of the chamber 10 has a greater etching rate (due to a higher concentration of the particles and/or a greater plasma field), the rotational speed of the substrate holder 12 may be adjusted by the process control system 21 to be smaller when the specific portion of the substrate 100 passes by the specific region of the chamber 10 than when the remaining portion of the substrate 100 passes by the specific region of the chamber 10, so as to make the specific portion of the substrate 100 have a longer etching time and/or a higher etching rate at the specific region, thereby achieving a better uniformity in terms of the post-process critical dimension.

Figure 11:
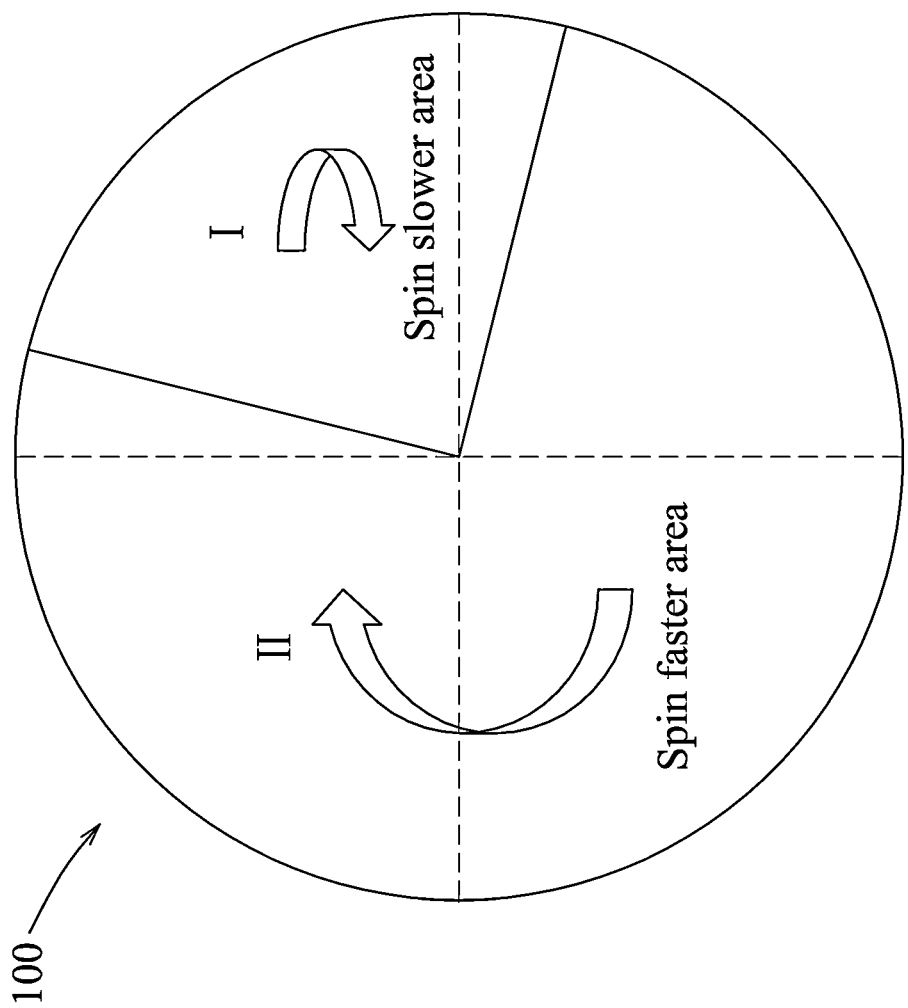
FIG. 11 is a schematic diagram illustrating that a substrate is rotated at a varying speed in accordance with some embodiments.

In FIG. 11, the substrate 100 that corresponds to the pre-process substrate data illustrate in FIG. 8 is exemplarily classified into a first portion (I) and a second portion (II), where the first portion (I) corresponds to an angular range between the 20-degree position and the 110-degree position of the substrate 100, and the measured values of the pre-process critical dimension in the first portion (I) are on average greater than those in the second portion (II). Accordingly, the process control system 21 may make adjustment to the rotational speed of the substrate holder 12 such that the first portion (I) passes by the specific region of the chamber 10 (which has a higher reaction rate) at a lower rotational speed (in comparison to the second portion (II) passing by the specific region of the chamber 10) and thus stays in the specific region longer.

Figure 12:
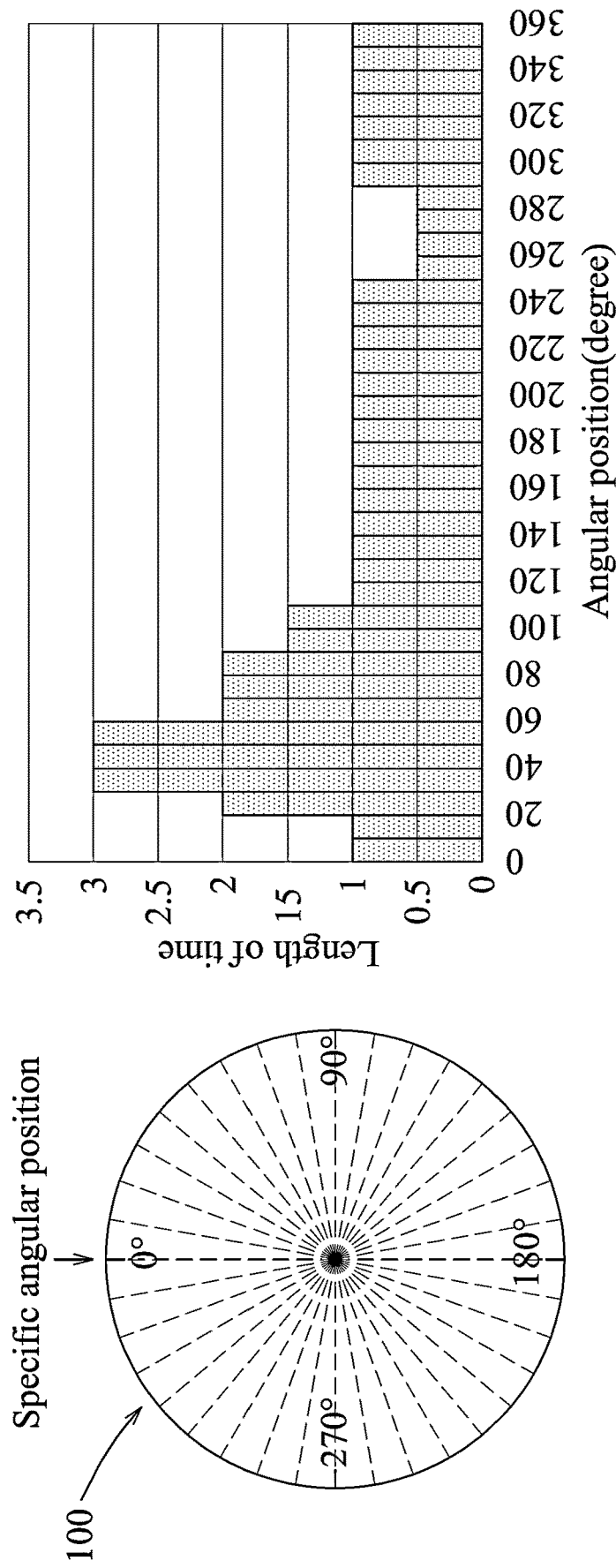
FIG. 12 is a schematic diagram illustrating that a substrate is rotated at a varying speed in accordance with some embodiments.

In FIG. 12, the substrate 100 that corresponds to the pre-process substrate data illustrate in FIG. 8 is exemplarily classified into thirty-six portions, each of which corresponds to an individual 10-degree range of the substrate 100. In the right part of FIG. 12, the numbers on the vertical axis represent a length of time each portion of the substrate 100 takes to pass by a specific angular position that corresponds to the specific region (with a higher reaction rate) of the chamber 10. In other words, a greater number on the vertical axis represents a smaller rotational speed of the substrate holder 12. It is noted that the number "1" on the vertical axis represents a unit length of time a portion of the substrate 100 takes to pass by the specific angular position when the substrate holder 12 rotates at a regular rotational speed as indicated in the substrate process recipe. As exemplified in FIG. 12 where the specific angular position is assumed to be at the 12-o'clock position of the substrate 100 and the substrate holder 12 rotates in a counterclockwise direction, rotation from the 20-degree position to the 110-degree position is slower than the regular rotational speed (i.e., the speed of rotation from the 0-degree position to the 20-degree position, from the 110-degree position to the 250-degree position, and from the 290-degree position to the 360-degree position), and rotation from the 250-degree position to the 290-degree position is faster than the regular rotational speed. For example, in a case that the unit length of time is 0.2 seconds, rotation from 20 degrees to 30 degrees takes $0.2 \times 2 = 0.4$ seconds, rotation from 30 degrees to 40 degrees takes $0.2 \times 3 = 0.6$ seconds, rotation from 250 degrees to 260 degrees costs $0.2 \times 0.5 = 0.1$ seconds, and so on.

In some embodiments, the rotation and the tilt of the substrate holder 12 may be applied at the same time. In one example where the reaction environment in the chamber 10 is uniform and the substrate 100 corresponds to the pre-process substrate data illustrated in FIG. 6, the adjustment calculated by the process control system 21 may include tilting the substrate holder 12 to create an uneven reaction environment for the substrate 100 (e.g., the lifted portion of the substrate 100 may have a higher reaction rate), and rotating the substrate holder 12 in a varying rotational speed as described in relation to FIGS. 11 and 12. In one example where the reaction environment in the chamber 10 is non-uniform, the adjustment calculated by the process control system 21 may include tilting the substrate holder 12 to reduce the non-uniformity of the reaction environment for the substrate 100, and may also include rotating the substrate holder 12 as described hereinabove to achieve the desired processing result.

Figure 13:
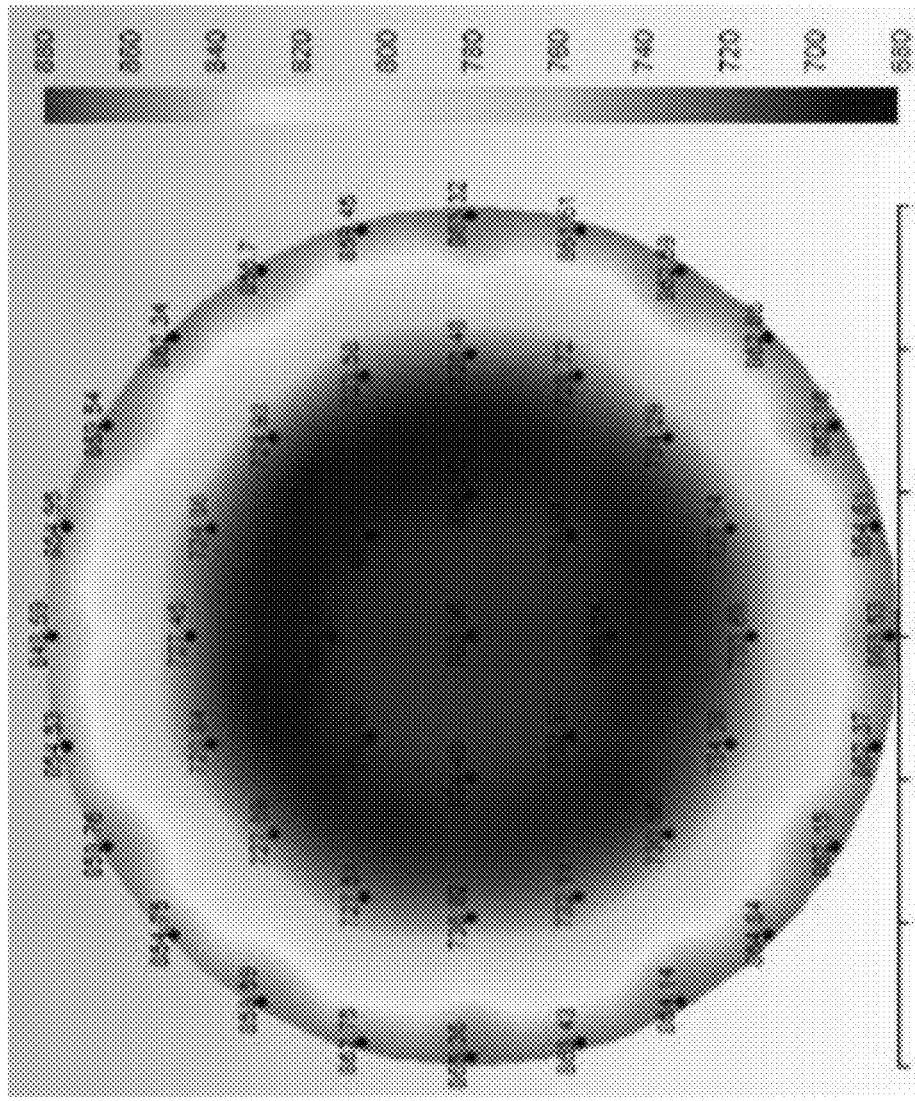
FIG. 13 is a plot illustrating a piece of post-process substrate data indicating that a post-process critical dimension measured at a peripheral portion of a substrate is greater than that measured at a central portion of the substrate on average.

As illustrated in FIG. 2, after completion of the process, the substrate 100 is formed with a plurality of the second mask features 118 that respectively correspond to the fin-shape first mask features 104. The second mask features 118 have a post-process critical dimension (e.g., the widths of the second mask features 118) that is related to or defined by the pre-process critical dimension because the second mask features 118 are formed using the first mask feature 104 as an etching mask in the etching process. Subsequently, the substrate 100 may be transferred to the metrology tool 3 for measuring the post-process critical dimension at multiple portions of the substrate 100, and for generating post-process substrate data that indicates the measured values of the post-process critical dimension and/or a profile or a distribution of the post-process critical dimension of the substrate 100 (step 410 in FIG. 4). The post-process substrate data reflects the effects of the adjustment calculated by the process control system 21, and is provided to the process control system 21, so the process control system 21 can perform the recipe adjustment calculation for a next substrate (step 412 in FIG. 4), which is formed with the first mask features 104 having the pre-process critical dimension, based on another pre-process substrate data generated for the next substrate and also the post-process substrate data generated for the substrate 100 (or further based on the apparatus data), thereby optimizing the adjustment to be made to the substrate process recipe that corresponds to the next substrate because the post-process substrate data is taken into account. In one example, if the post-process substrate data obtained for the substrate 100 that corresponds to the pre-process substrate data exemplified in FIG. 6 shows that the post-process critical dimension measured at the peripheral portion of the substrate 100 is smaller than that measured at the central portion of the substrate 100 on average (e.g., the profile of the post-process critical dimension has a dome-shape), the process control system 21 may derive that the rotational speed of the substrate holder 12 is not fast enough, and may promote the rotational speed of the substrate holder 12 for the substrate process recipe that corresponds to the next substrate if the pre-process substrate data corresponding to the next substrate is also similar to that exemplified in FIG. 6. In one example, if the post-process substrate data obtained for the substrate 100 that corresponds to the pre-process substrate data exemplified in FIG. 6 shows that the post-process critical dimension measured at the peripheral portion of the substrate 100 is greater than that measured at the central portion of the substrate 100 on average (e.g. the profile of the post-process critical dimension has a U-shape) as exemplified in FIG. 13, the process control system 21 may derive that the rotational speed of the substrate holder 12 is too fast, and may reduce the rotational speed of the substrate holder 12 for the substrate process recipe that corresponds to the next substrate if the pre-process substrate data corresponding to the next substrate is also similar to that exemplified in FIG. 6. In one example, if the post-process substrate data obtained for the substrate 100 that corresponds to the pre-process substrate data exemplified in FIG. 8 shows that the post-process critical dimension measured at the specific portion of the substrate 100 (i.e., the portion that corresponds to an angular range between the 20-degree position and the 110-degree position of the substrate 100) is smaller than that measured at the remaining portion of the substrate 100 on average, the process control system 21 may derive that the tilt angle of the substrate holder 12 is too large, and may decrease the tilt angle of the substrate holder 12 for the substrate process recipe that corresponds to the next substrate if the pre-process substrate data corresponding to the next substrate is also similar to that exemplified in FIG. 8. In one example, if the post-process substrate data obtained for the substrate 100 that corresponds to the pre-process substrate data exemplified in FIG. 8 shows that the post-process critical dimension measured at the specific portion of the substrate 100 is greater than that measured at the remaining portion of the substrate 100 on average, the process control system 21 may derive that the tilt angle of the substrate holder 12 is too small, and may increase the tilt angle of the substrate holder 12 for the substrate process recipe that corresponds to the next substrate if the pre-process substrate data corresponding to the next substrate is also similar to that exemplified in FIG. 8.

Figure 14:
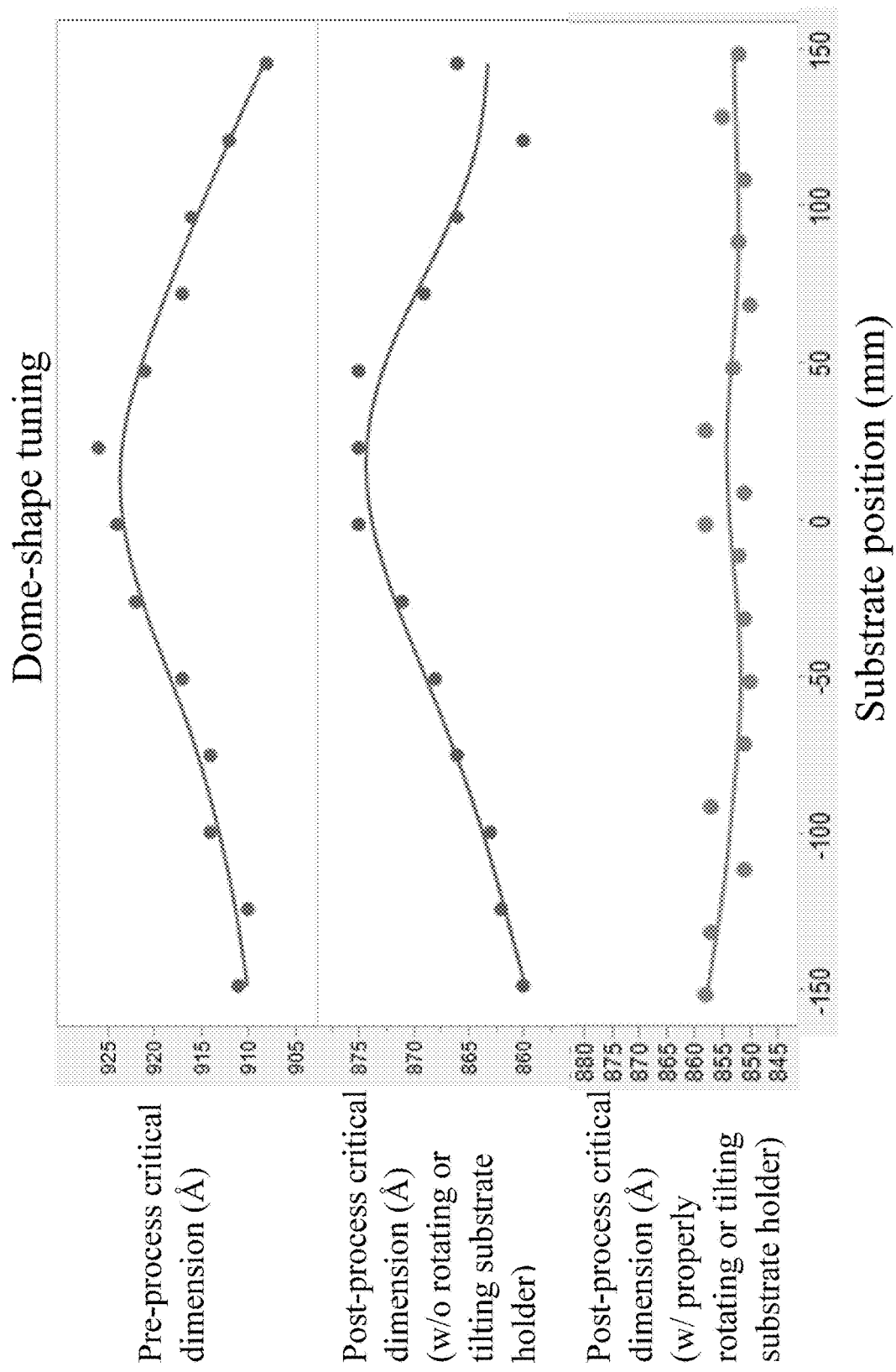
FIG. 14 is a plot illustrating the improvement in terms of profile uniformity in accordance with some embodiments.

FIG. 14 illustrates results of an exemplary process where the etching apparatus 1 performs an etching process on a substrate having a dome-shape profile (see the upper plot of FIG. 14) in terms of the pre-process critical dimension (i.e., the pre-process critical dimension measured at the central portion of the substrate 100 is greater than the that measured at the peripheral portion of the substrate 100). In FIG. 14, the middle plot exemplarily shows a process result where the substrate holder 12 was neither rotated nor tilted during the process, and the lower plot exemplarily shows a process result where the substrate holder 12 was appropriately rotated and/or tilted during the process according to the recipe adjustment data that is calculated by the process control system 21 based on the pre-process substrate data. By virtue of appropriately rotating and/or tilting the substrate holder 12, the uniformity is improved by about 32%.

Figure 15:
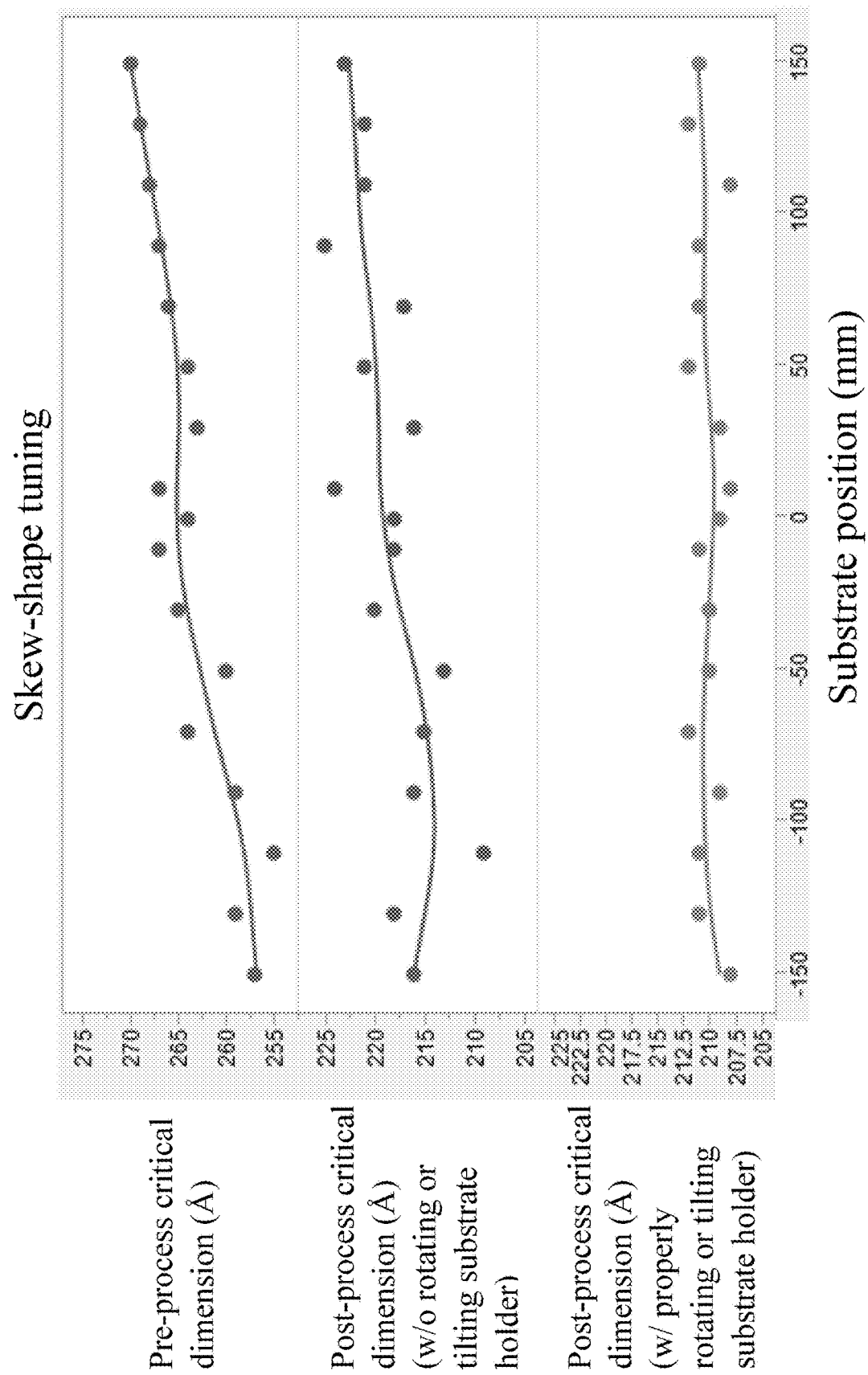
FIG. 15 is a plot illustrating the improvement in terms of profile uniformity in accordance with some embodiments.

FIG. 15 illustrates results of an exemplary process where the etching apparatus 1 performs an etching process on a substrate having a skew-shape profile (see the upper plot of FIG. 15) in terms of the pre-process critical dimension (i.e., the values of the pre-process critical dimension measured at one side of the substrate are greater than the values of the pre-process critical dimension measured at another side of the substrate; the pre-process substrate data as exemplified in FIG. 8 belonging to this type). In FIG. 15, the middle plot exemplarily shows a process result where the substrate holder 12 was neither rotated nor tilted during the process, and the lower plot exemplarily shows a process result where the substrate holder 12 was appropriately rotated and/or tilted during the process according to the recipe adjustment data that is calculated by the process control system 21 based on the pre-process substrate data. By virtue of appropriately rotating and/or tilting the substrate holder 12, the uniformity is improved by about 51%.

Figure 16:
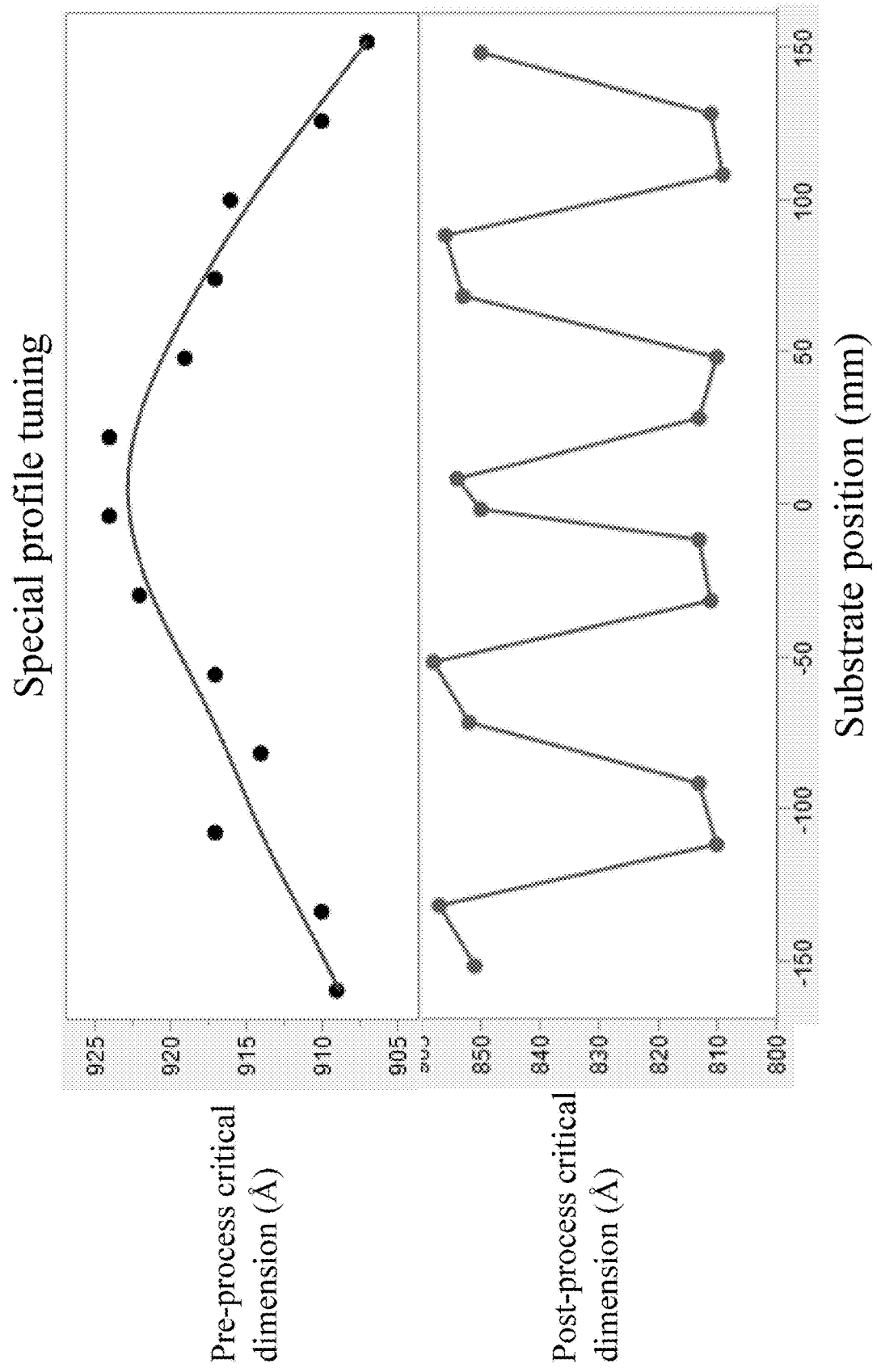
FIG. 16 is a plot illustrating that a special zigzag profile can be achieved in accordance with some embodiments.
Figure 17:
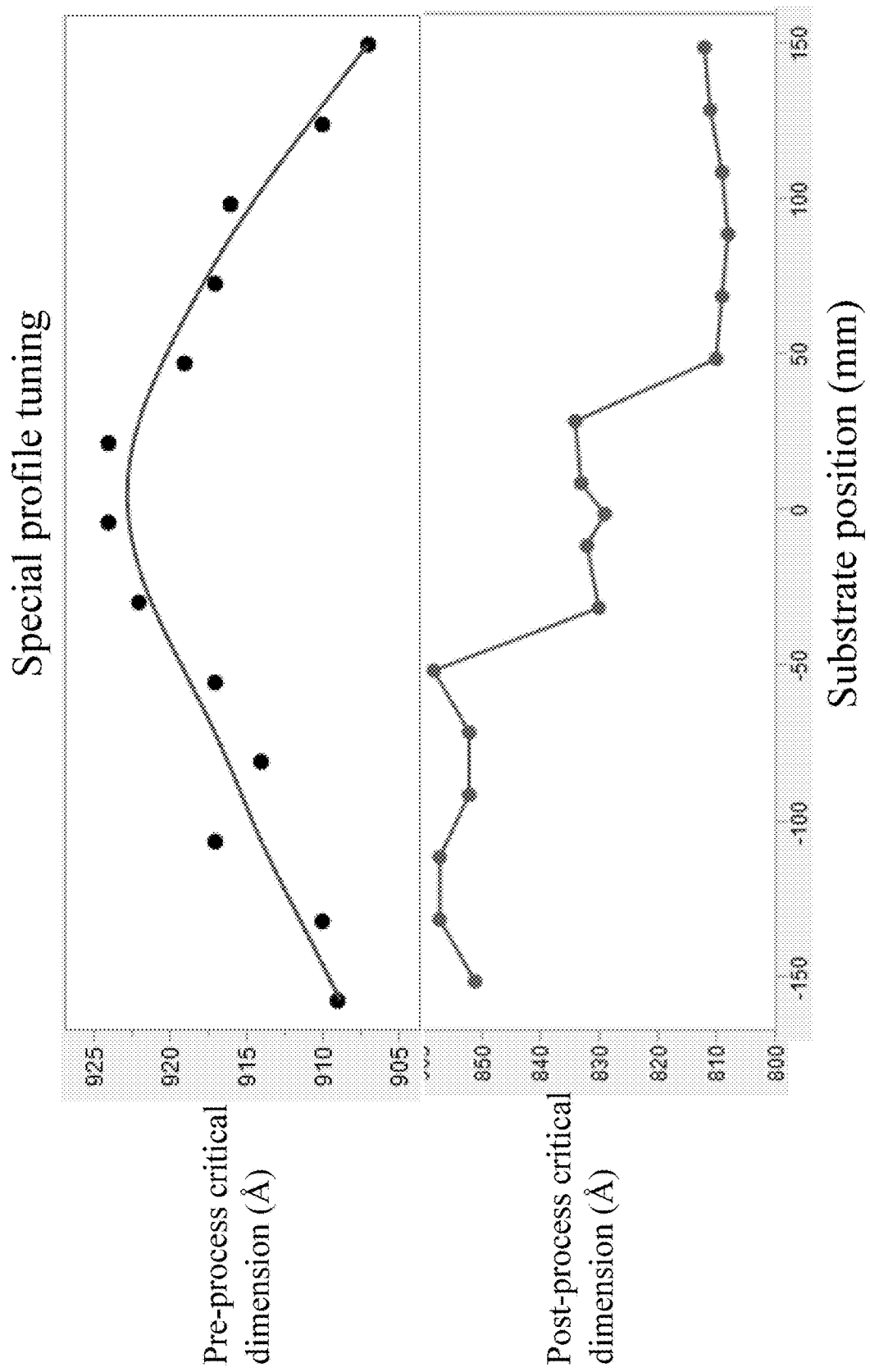
FIG. 17 is a plot illustrating that a special stair profile can be achieved in accordance with some embodiments.

In addition to improving the uniformity of the critical dimension, the process control system 21 may perform the recipe adjustment calculation based on the pre-process substrate data, so as to generate the recipe adjustment data where the rotational speed and/or the tilt angle of the substrate holder 12 are adjusted to achieve some special profiles of the post-process critical dimension. FIG. 16 exemplarily illustrates in the lower plot a special zigzag profile of the post-process critical dimension for a substrate having a profile of the pre-process critical dimension as shown in the upper plot. Such a special zigzag profile is expected to be achieved by properly rotating and tilting the substrate holder 12 during an etching process. FIG. 17 exemplarily illustrates in the lower plot a special stair profile of the post-process critical dimension for a substrate having a profile of the pre-process critical dimension as shown in the upper plot. Such a special stair profile is expected to be achieved by properly rotating and tilting the substrate holder 12 during an etching process.

In summary, the system provided in this disclosure can compensate for the effects resulting from uneven reaction environment (e.g., uneven plasma field, uneven gas flow, and/or uneven concentration of particles) and/or poor profile of incoming substrate in terms of pre-process critical dimension by rotating and/or tilting the substrate holder 12, so as to achieve good uniformity of post-process critical dimension that is related to the pre-process critical dimension. Some special profile of the post-process critical dimension may be formed by properly rotating and/or tilting the substrate during the etching process. Furthermore, after completion of the process, the post-process critical dimension is measured at multiple portions of the substrate to generate post-process substrate data that can serve as feedback information for the process control system 21 to optimize further adjustment of the process.

In accordance with some embodiments of the present disclosure, a method for controlling a profile of a critical dimension of a substrate is provided. A plurality of first features are formed on the substrate. The first features have a pre-process critical dimension. The pre-process critical dimension of the first features are measured at multiple portions of the substrate to generate pre-process substrate data that indicates measured values of the pre-process critical dimension. The substrate is placed on a substrate holder of an etching apparatus for performing an etching process on the substrate. The etching process corresponds to a substrate process recipe predetermined for the substrate, and, in the etching process, a plurality of particles being provided over the substrate. A recipe adjustment calculation is performed for the substrate to generate recipe adjustment data. The recipe adjustment calculation includes calculating adjustment to be made to the substrate process recipe based on the pre-process substrate data. The recipe adjustment data indicates the adjustment thus calculated, and the adjustment includes one of rotating the substrate holder and tilting the substrate holder. Process parameters of the etching process for the substrate are determined based on the substrate process recipe and the recipe adjustment data, and the etching process is performed on the substrate according to the process parameters, so as to form a plurality of second features that correspond to the first features. The second features have a post-process critical dimension related to the pre-process critical dimension.

In accordance with some embodiments of the present disclosure, a system for performing an etching process on a substrate is provided to include an etching apparatus. The etching apparatus includes a chamber, a substrate holder, a spindle, a motor and a control block. The chamber is for performing the etching process on the substrate therein. In the etching process, a plurality of particles are provided over the substrate. The substrate holder is disposed in the chamber for placing the substrate thereon. The spindle is connected to the substrate holder. The motor is connected to the spindle. The control block is electrically connected to the motor, is disposed to receive process data related to the etching process, and is configured to control the first motor to rotate the substrate holder through the spindle based on the process data, so as to bring the substrate into rotation during the etching process.

In accordance with some embodiments of the present disclosure, a method for controlling a profile of a critical dimension of a substrate is provided. A plurality of first features having a pre-process critical dimension on the substrate is formed on the substrate. A profile of the pre-process critical dimension is analyzed for the substrate. An etching process is performed on the substrate to form a plurality of second features on the substrate. The second features correspond to the first features and have a post-process critical dimension that is related to the pre-process critical dimension. The substrate is rotated during the etching process when analysis of the profile of the pre-process critical dimension reveals that the pre-process critical dimension measured at a peripheral portion of the substrate is smaller than that measured at a central portion of the substrate on average. The substrate is tilted during the etching process when analysis of the profile of the pre-process critical dimension reveals that the pre-process critical dimension measured at a specific portion of the substrate that corresponds to a specific angular range of the substrate is greater than that measured at the remaining portions of the substrate on average.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for controlling a profile of a critical dimension of a substrate, comprising:
   forming a plurality of first features having a pre-process critical dimension on the substrate;
   analyzing a profile of the pre-process critical dimension for the substrate; and
   performing an etching process on the substrate to form a plurality of second features on the substrate, wherein the second features correspond to the first features and have a post-process critical dimension that is related to the pre-process critical dimension;
   wherein the substrate is rotated during the etching process when analysis of the profile of the pre-process critical dimension reveals a first condition that the pre-process critical dimension measured at a peripheral portion of the substrate is smaller than that measured at a central portion of the substrate on average;
   wherein a rotational speed at which the substrate is rotated is positively correlated to a difference between an average value of the pre-process critical dimension measured at the peripheral portion of the substrate and an average value of the pre-process critical dimension measured at the central portion of the substrate.

2. The method of claim 1, wherein the substrate is tilted during the etching process when analysis of the profile of the pre-process critical dimension reveals a second condition that the pre-process critical dimension measured at a specific portion of the substrate that corresponds to a specific angular range of the substrate is greater than that measured at the remaining portions of the substrate on average.

3. The method of claim 2, wherein the substrate is tilted in such a way that the specific portion of the substrate is lifted when the analysis of the profile of the pre-process critical dimension reveals the second condition.

4. The method of claim 2, wherein the etching process is performed in an etching apparatus, and the tilting of the substrate creates a specific region of the etching apparatus that has a higher etching rate for the substrate than other regions of the etching apparatus; and
   wherein the substrate is rotated in such a way that a rotational speed of the substrate holder is smaller when the specific portion of the substrate passes by the specific region of the etching apparatus than when the remaining portion of the substrate passes by the specific region of the etching apparatus.

5. The method of claim 2, wherein the etching process is performed in an etching apparatus, and the tilting of the substrate creates a specific region of the etching apparatus that has a higher etching rate for the substrate than other regions of the etching apparatus; and
 wherein the substrate is rotated at a varying rotational speed during the etching process.

6. The method of claim 1, further comprising: analyzing a piece of apparatus data that indicates non-uniformity of the etching apparatus where the etching process is performed;
 wherein the substrate is rotated at a varying rotational speed during the etching process when the piece of apparatus data indicates that the etching apparatus is not uniform in terms of etching rates and when analysis of the profile of the pre-process critical dimension reveals a second condition that the pre-process critical dimension measured at a specific portion of the substrate that corresponds to a specific angular range of the substrate is greater than that measured at the remaining portions of the substrate on average.

7. The method of claim 6, wherein, when the piece of apparatus data indicates that the etching apparatus has a specific region with a higher etching rate than other regions, and when analysis of the profile of the pre-process critical dimension reveals the second condition, the substrate is rotated, during the etching process, in such a way that a rotational speed of the substrate is slower when the specific portion of the substrate passes by the specific region of the etching apparatus than when the remaining portion of the substrate passes by the specific region of the etching apparatus.

8. A method for controlling a profile of a critical dimension of a substrate, comprising:
 forming a plurality of first features having a pre-process critical dimension on the substrate;
 analyzing a profile of the pre-process critical dimension for the substrate; and
 performing an etching process on the substrate to form a plurality of second features on the substrate, wherein the second features correspond to the first features and have a post-process critical dimension that is related to the pre-process critical dimension;
 wherein the substrate is tilted during the etching process when analysis of the profile of the pre-process critical dimension reveals a first condition that the pre-process critical dimension measured at a specific portion of the substrate that corresponds to a specific angular range of the substrate is greater than that measured at the remaining portions of the substrate on average.

9. The method of claim 8, wherein the substrate is tilted in such a way that the specific portion of the substrate is lifted when the analysis of the profile of the pre-process critical dimension reveals the first condition.

10. The method of claim 8, wherein the etching process is performed in an etching apparatus, and the tilting of the substrate creates a specific region of the etching apparatus that has a higher etching rate for the substrate than other regions of the etching apparatus; and
 wherein the substrate is rotated at a varying rotational speed during the etching process.

11. The method of claim 8, wherein the etching process is performed in an etching apparatus, and the tilting of the substrate creates a specific region of the etching apparatus that has a higher etching rate for the substrate than other regions of the etching apparatus; and
 wherein the substrate is rotated in such a way that a rotational speed of the substrate holder is smaller when the specific portion of the substrate passes by the specific region of the etching apparatus than when the remaining portion of the substrate passes by the specific region of the etching apparatus.

12. The method of claim 8, wherein the substrate is rotated during the etching process when analysis of the profile of the pre-process critical dimension reveals a second condition that the pre-process critical dimension measured at a peripheral portion of the substrate is smaller than that measured at a central portion of the substrate on average.

13. The method of claim 8, further comprising: analyzing a piece of apparatus data that indicates non-uniformity of the etching apparatus where the etching process is performed;
 wherein the substrate is rotated at a varying rotational speed during the etching process when the piece of apparatus data indicates that the etching apparatus is not uniform in terms of etching rates and when analysis of the profile of the pre-process critical dimension reveals a second condition that the pre-process critical dimension measured at a specific portion of the substrate that corresponds to a specific angular range of the substrate is greater than that measured at the remaining portions of the substrate on average.

14. The method of claim 13, wherein, when the piece of apparatus data indicates that the etching apparatus has a specific region with a higher etching rate than other regions, and when analysis of the profile of the pre-process critical dimension reveals the second condition, the substrate is rotated, during the etching process, in such a way that a rotational speed of the substrate is slower when the specific portion of the substrate passes by the specific region of the etching apparatus than when the remaining portion of the substrate passes by the specific region of the etching apparatus.

15. A method for controlling a profile of a critical dimension of a substrate, comprising:
 forming a plurality of first features having a pre-process critical dimension on the substrate;
 analyzing a profile of the pre-process critical dimension for the substrate;
 analyzing a piece of apparatus data that indicates non-uniformity of the etching apparatus where the etching process is performed; and
 performing an etching process on the substrate to form a plurality of second features on the substrate, wherein the second features correspond to the first features and have a post-process critical dimension that is related to the pre-process critical dimension;
 wherein the substrate is rotated at a varying rotational speed during the etching process when the piece of apparatus data indicates that the etching apparatus is not uniform in terms of etching rates and when analysis of the profile of the pre-process critical dimension reveals a first condition that the pre-process critical dimension measured at a specific portion of the substrate that corresponds to a specific angular range of the substrate is greater than that measured at the remaining portions of the substrate on average.

16. The method of claim 15, wherein, when the piece of apparatus data indicates that the etching apparatus has a specific region with a higher etching rate than other regions, and when analysis of the profile of the pre-process critical dimension reveals the first condition, the substrate is rotated, during the etching process, in such a way that a rotational speed of the substrate is slower when the specific portion of the substrate passes by the specific region of the etching apparatus than when the remaining portion of the substrate passes by the specific region of the etching apparatus.

17. The method of claim 15, wherein the substrate is tilted during the etching process when analysis of the profile of the pre-process critical dimension reveals a second condition that the pre-process critical dimension measured at a specific portion of the substrate that corresponds to a specific angular range of the substrate is greater than that measured at the remaining portions of the substrate on average.

18. The method of claim 17, wherein the substrate is tilted in such a way that the specific portion of the substrate is lifted when the analysis of the profile of the pre-process critical dimension reveals the second condition.

19. The method of claim 17, wherein the etching process is performed in an etching apparatus, and the tilting of the substrate creates a specific region of the etching apparatus that has a higher etching rate for the substrate than other regions of the etching apparatus; and
    wherein the substrate is rotated at a varying rotational speed during the etching process.

20. The method of claim 17, wherein the etching process is performed in an etching apparatus, and the tilting of the substrate creates a specific region of the etching apparatus that has a higher etching rate for the substrate than other regions of the etching apparatus; and
    wherein the substrate is rotated in such a way that a rotational speed of the substrate holder is smaller when the specific portion of the substrate passes by the specific region of the etching apparatus than when the remaining portion of the substrate passes by the specific region of the etching apparatus.

\* \* \* \* \*